(12) United States Patent
Hersam et al.

(10) Patent No.: US 8,099,792 B1
(45) Date of Patent: Jan. 17, 2012

(54) METHODS AND APPARATUS FOR SPATIALLY RESOLVED PHOTOCURRENT MAPPING OF OPERATING PHOTOVOLTAIC DEVICES USING ATOMIC FORCE PHOTOVOLTAIC MICROSCOPY

(75) Inventors: Mark C. Hersam, Evanston, IL (US); Benjamin Leever, Kettering, OH (US)

(73) Assignees: Northwestern University, Evanston, IL (US); The United States of America as represented by the Secretary of the Air Force, Washington, DC (US)

( * ) Notice: Subject to any disclaimer, the term of this patent is extended or adjusted under 35 U.S.C. 154(b) by 349 days.

(21) Appl. No.: 12/319,454

(22) Filed: Jan. 7, 2009

Related U.S. Application Data

(60) Provisional application No. 61/010,293, filed on Jan. 7, 2008.

(51) Int. Cl.
*G01N 23/00* (2006.01)
*G01B 5/28* (2006.01)

(52) U.S. Cl. ............ 850/19; 850/1; 850/3; 850/20; 850/21; 850/40; 850/53

(58) Field of Classification Search ........... 850/1, 3, 850/19, 20, 21, 40, 53
See application file for complete search history.

(56) References Cited

U.S. PATENT DOCUMENTS

| | | | |
|---|---|---|---|
| 5,196,701 A * | 3/1993 | Foster et al. ............... | 850/3 |
| 5,874,734 A | 2/1999 | Elings et al. | |
| 6,198,097 B1 * | 3/2001 | Abbate et al. .............. | 850/3 |
| 6,690,008 B2 * | 2/2004 | Hantschel et al. .......... | 850/40 |
| 6,787,768 B1 * | 9/2004 | Kley et al. ................. | 850/59 |
| 6,861,648 B2 * | 3/2005 | Kley ........................ | 850/20 |
| 6,975,129 B2 * | 12/2005 | Chang ...................... | 850/19 |
| 7,093,509 B2 * | 8/2006 | Shao et al. ................. | 73/866 |
| 7,358,490 B1 | 4/2008 | Hersam et al. | |
| 2005/0030054 A1 * | 2/2005 | Chang ...................... | 324/762 |
| 2010/0017922 A1 * | 1/2010 | Shin et al. ................. | 850/21 |
| 2010/0180354 A1 * | 7/2010 | Degertekin ................ | 850/1 |

OTHER PUBLICATIONS

Pingree, LSC; Hersam, MC; Kern, MM; Scott, BJ; Marks, TJ. Spatially-resolved electroluminescence of operating organic light-emitting diodes using conductive atomic force microscopy. Applied Physics Letters, vol. 85, No. 2, Jul. 12, 2004, pp. 344-346.

Mihailetchi, VD; Xie, H; De Boer, B; Popescu, LM; Hummelen, JC; Blom, PWM. Origin of the enhanced performance in poly(3-hexylthiophene): [6,6]-phenyl C61-butyric acid methyl ester solar cells upon slow drying of the active layer. Applied Physics Letters 89, 012107 (2006).

Douhérat, O; Lutsen, L; Swinnen, A; Breselge, M; Vandewal, K; Goris, L; Manca, J. Nanoscale electrical characterization of organic photovoltaic blends by conductive atomic force microscopy. Applied Physics Letters, 89, 032107 (2006).

Günes, S; Neugebauer, H; Sariciftci, NS. Conjugated Polymer-Based Organic Solar Cells. Chem. Rev. 2007, 107, 1324-1338.

Smith, AP; Smith RR; Taylor, BE; Durstock, MF. An Investigation of Poly(thienylene vinylene) in Organic Photovoltaic Devices. Chem. Mater. 2004, 16, 4687-4692.

(Continued)

*Primary Examiner* — David A Vanore

(74) *Attorney, Agent, or Firm* — Reinhart Boerner Van Deuren s.c.

(57) ABSTRACT

Atomic force photovoltaic microscopy apparatus and related methodologies, as can be used to quantitatively measure spatial performance variations in functioning photovoltaic devices.

19 Claims, 4 Drawing Sheets

OTHER PUBLICATIONS

Gatzel, T; Hoppe, H; Sariciftci, NS; Lux-Steiner, MC; Komiyama, M. Kelvin Probe force Microscopy Study of Conjugated Polymer/Fullerene Organic Solar Cells. Japanese Journal of Applied Physics. vol. 44, No. 7B, 2005, pp. 5370-5373.

Peumans, P; Yakimov, A; Forrest, SR. Small molecular weight organic thin-film photodetectors and solar cells. Journal of Applied Physics, vol. 93, No. 7, Apr. 1, 2003, pp. 3693-3723.

McNeill, CR; Dastoor, PC. Photocurrent pattern formation in polymer/methanofullerene blends imaged by near-field scanning photocurrent microscopy. Journal of Applied Physics 99, 033502 (2006).

De Wolf, P; Vandervorst, W; Smith, H; Khalil, N. Comparison of two-dimensional carrier profiles in metal-oxide-semiconductor field-effect transistor structures obtained with scanning spreading resistance microscopy in inverse modeling. J. Vac. Sci. Technol. B 18(1), Jan./Feb. 2000. pp. 540-544.

Snaith, HJ; Arias, AC; Morteani, AC; Silva, C; Friend, RH. Charge Generation Kinetics and Transport Mechanisms in Blended Polufluorene Photovoltaic Devices. Nano Letters, 2002, vol. 2, No. 12, pp. 1353-1357.

Yang, X; Loos, J; Veenstra, SC; Verhees, WJH; Wienk, MM; Kroon, JM; Michels, MAJ; Janssen, RAJ. Nanoscale Morphology of High-Performance Polymer Solar Cells. Nano Letters, 2005, vol. 5, No. 4, pp. 579-583.

McNeill, CR; Watts, B; Thomsen, L; Belcher, WJ; Greenham, NC Dastoor, PC. Nanoscale Quantitative Chemical Mapping of Conjugated Polymer Blends. Nano Letters, 2006, vol. 6, No. 6, pp. 1202-1206.

Coffey, DC; Reid, OG; Radovsky, DB; Bartholomew, GP; Ginger, DS. Mapping Local Photocurrents in Polymer/Fullerene Solar Cells with Photoconductive Atomic Force Microscopy. Nano Letters, 2007, Vol. 7, No. 3, pp. 738-744.

Coffey, DC; Ginger, DS. Time-resolved electrostatic force microscopy of polymer solar cells. Nature Materials, vol. 5, Sep. 2006, pp. 735-740.

Pingree, LSC; Russell, MT; Scott, BJ; Marks, TJ; Hersam, MC. Probing individual nanoscale organic light-emitting diodes with atomic force electroluminescence microscopy and bridge-enhanced nanoscale impedance microscopy. Organic Electronics 8 (2007) 465-479.

Kawano, K; Pacios, R; Poplavskyy, D; Nelson, J; Bradley, DDC; Durrant, JR. Degradation of organic solar cells due to air exposure. Solar Energy Materials & Solar Cells 90 (2006) 3520-3530.

Glatthaar, M; Riede, M; Keegan, N; Sylvester-Hvid, K; Zimmermann, B; Niggemann, M; Hinsch, A; Gombert, A. Efficiency limited factors of organic bulk heterojunction solar cells identified by electrical impedance spectroscopy. Solar Energy Materials & Solar Cells 91 (2007) 390-393.

Moutinho, HR; Dhere, RG; Jiang, C-S; Al-Jassim, MM; Kazmerski, LL. Electrical properties of CdTe/CdS solar cells investigated with conductive atomic force microscopy. Thin Solid Films 514 (2006) 150-155.

Alexeev, A; Loos, J; Koetse, MM. Nanoscale electrical characterization of semiconducting polymer blends by conductive atomic force microscopy (C-AFM). Ultramicroscopy 106 (2006) 191-199.

Hoppe, H; Niggemann, MP; Winder, C; Kraut, J; Hiesgen, R; Hinsch, A; Meissner, D; Sariciftci, S. Nanoscale Morphology of Conjugated Polymer/Fullerene-Based Bulk-Heterojunction Solar Cells. Adv. Funct. Mater. 2004, 14, No. 10, October, pp. 1005-1011.

Ma, W; Yang, C; Gong, X; Lee, K; Heeger, AJ. Thermally Stable, Efficient Polymer Solar Cells with Nanoscale Control of the Interpenetrating Network Morphology. Adv. Funct. Mater. 2005, 15, 1617-1622.

Hersam, MC; Hoole, ACF; O'Shea, SJ; Welland, ME. Potentiometry and repair of electrically stressed nanowires using atomic force microscopy. Applied Physics Letters, vol. 72, No. 8, Feb. 23, 1998. pp. 915-917.

Planès, J; Houzé, F; Chrétien, P; Schneegans, O. Conducting probe atomic force microscopy applied to organic conducting blends. Applied Physics Letters. vol. 79, No. 18, Oct. 29, 2001. pp. 2993-2995.

Lin, H-N; Lin, H-L; Wang, SS; Yu, L-S; Perng, G-Y; Chen, S-A; Chen, S-H. Nanoscale charge transport in an electroluminescent polymer investigated by conducting atomic force microscopy. Applied Physics Letters, vol. 81, No. 14, Sep. 30, 2002, pp. 2572-2574.

Rawlett, AM; Hopson, TJ; Nagahara, LA; Tsui, RK; Ramachandran, GK; Lindsay, SM. Electrical measurements of a dithiolated molecule via conducting atomic force microscopy. Applied Physics Letter, vol. 81, No. 16, Oct. 14, 2002, pp. 3043-3045.

Rashmi, AKK; Kumar, U; Balakrishnan, VR; Basu, PK. Degradation of process in organic thin film devices fabricated using P3HT. Pramana- J. Phys., vol. 68, No. 3, Mar. 2007, pp. 489-498.

* cited by examiner

METHODS AND APPARATUS FOR SPATIALLY RESOLVED PHOTOCURRENT MAPPING OF OPERATING PHOTOVOLTAIC DEVICES USING ATOMIC FORCE PHOTOVOLTAIC MICROSCOPY

This application claims priority benefit of application Ser. No. 61/010,293 filed Jan. 7, 2008, the entirety of which is incorporated herein by reference.

This invention was made with government support under Grant No. ECS-0609064 awarded by the National Science Foundation. The government has certain rights in the invention.

BACKGROUND OF THE INVENTION

The performance of organic photovoltaic (OPV) devices is most frequently characterized by the power conversion efficiency, $\eta_p$, which indicates the percentage of the radiant energy incident on the solar cell that is converted to electrical energy, and is determined by measuring the open-circuit voltage ($V_{oc}$), short-circuit current ($I_{sc}$), and fill factor from current-voltage plots. Although $\eta_p$ serves as a convenient benchmark for comparing photovoltaic devices, it does not reveal information about local photocurrent spatial variations within these devices. Localized efficiency variations might be expected in bulk-heterojunction (BHJ) OPVs from defects as well as from the interpenetrating phase-separated nature of the microstructure, evident in morphological studies by atomic force microscopy, transmission electron microscopy, scanning electron microscopy, and scanning transmission X-ray microscopy.

Correlations between electrical properties and morphology in bulk heterojunction OPV films have previously been demonstrated with scanning probe techniques. For example, a morphology-work function relationship in poly(2-methoxy-5-(3',7'-dimethyloctyloxy))-p-phenylene vinylene: [6,6]-phenyl-$C_{61}$-butyric acid methyl ester (MDMO-PPV: PCBM) films was demonstrated by Kelvin probe force microscopy (KPFM). Similarly, a correspondence between morphology and photocurrent was established in polyfluorene films by near-field scanning photocurrent microscopy (NSPM). However, NSPM lateral resolution is limited to ~200 nm by the tip aperture.

Atomic force microscopy is described generally in U.S. Pat. No. 6,642,517, the entirety of which—and, in particular, FIGS. 1-2, 4 and 6-7 and corresponding descriptions thereof and the references cited therein—is incorporated herein by reference. More specifically, conductive atomic force microscopy (cAFM) has recently proven to be an effective method for probing current flow and resistivity variations with nanometer scale spatial resolution in gold nanowires, silicon field effect transistors, individual organic molecules, conducting polymer blends, and emissive polymers. See, respectively: M. C. Hersam, A. C. F. Hoole, S. J. O'Shea, and M. E. Welland, *Appl. Phys. Lett.* 72, 915 (1998); P. De Wolf, W. Vandervorst, H. Smith, and N. Khalil, *J. Vac. Sci. Technol. B* 18, 540 (2000); A. M. Rawlett, T. J. Hopson, L. A. Nagahara, R. K. Tsui, G. K. Ramachandran, and S. M. Lindsay, *Appl. Phys. Lett.* 81, 3043 (2002); J. Planes, F. Houzé, P. Chrétien, and O. Schneegans, *Appl. Phys. Lett.* 79, 2993 (2001); and H.-N. Lin, H.-L. Lin, S.-S. Wang, L.-S. Yu, G.-Y. Perng, S.-A. Chen, and S.-H. Chen, *Appl. Phys. Lett.* 81, 2572 (2002).

Since the cAFM tip is used locally, cAFM can directly correlate optoelectronic stimulation with nanometer scale spatial resolution. With appropriate collection optics and photon detectors, the resulting photocurrent can be spatially correlated with the cAFM tip position, thus enabling nanometer scale photocurrent mapping. cAFM is described generally in U.S. Pat. No. 5,874,734, the entirety of which is incorporated hereby by reference. Thus, cAFM and analogous scanning tunneling microscopy measurements have been used to spatially map current in a variety of organic materials. However, in these studies, the conductive tip was brought directly into contact with the organic material. Again, while such direct electrical contact with the materials is sufficient to induce current, a point contact of this type is inevitably different from the evaporated electrical contacts fabricated in actual photovoltaic devices.

Recently, two scanning probe techniques having sub-100 nm lateral spatial resolution and calibrated light sources were reported: 1) Time-resolved electrostatic force microscopy (trEFM) was used to simultaneously measure localized photoinduced charging rates and topography in a polyfluorene film, 2) Photoconductive AFM (pcAFM) employed a laser to illuminate a BHJ film while measuring topography and photocurrent with a conductive platinum-coated probe. Again, while both techniques provide quantitative correlations between electrical properties and morphology, they characterize photovoltaic films rather than functioning photovoltaic devices.

SUMMARY OF THE INVENTION

In light of the foregoing, it is an object of the present invention to provide one or more methods and/or apparatus for use in conjunction therewith to spatially-resolve photocurrent and/or power conversion efficiency of an operating photovoltaic device, thereby overcoming various deficiencies and shortcomings of prior art, including those outlined above. It will be understood by those skilled in the art that one or more aspects of this invention can meet certain objectives, while one or more other aspects can meet certain objectives. Each objective may not apply equally, in all its respects, to every aspect of this invention. As such, the following objects can be viewed in the alternative with respect to any one aspect of this invention.

It is an object of the present invention to provide a method and/or apparatus to evaluate operative photovoltaic devices, after assembly and fabrication of associated electrode or contact components, as opposed to characterization of the optoelectrical properties of a constituent optoelectric material.

It is another object of the present invention to provide a conductive atomic force microscopic technique to simultaneously image photovoltaic device topography, current generation and light conversion during device operation.

It is another object of the present invention to provide one or more methods in conjunction with an associated apparatus configuration, to analyze local response and failure processes associated with photovoltaic device arrays.

Other objects, features, benefits and advantages of this invention would be apparent from the summary, in conjunction with the following descriptions of certain embodiments, and will be readily apparent to those skilled in the art having knowledge of various conductive atomic force microscopic techniques, photovoltaic devices and performance criteria. Such objects, features, benefits and advantages will be apparent from the above as to taken into conjunction with the accompanying examples, data, figures and all reasonable inferences to be drawn therefrom, alone or with consideration of the references incorporated herein.

In part, this invention can be directed to a method of using conductive atomic force microscopy for photocurrent characterization of a photovoltaic device. Such a method can comprise providing an operative photovoltaic device comprising an anode, a cathode and at least one optoelectric component therebetween; illuminating such a device; contacting the device and/or an electrode thereof with a conductive atomic force microscope comprising a biased current conductive cantilever tip; and correlating photocurrent and/or various aspects thereof (e.g., without limitation, power conversion efficiency) with position of the conductive tip on the illuminated device. Illumination can be at least partially sufficient to generate and/or induce photocurrent.

In certain non-limiting embodiments, the conductive tip can be at a constant bias and/or at a fixed position on an electrode for photocurrent characterization, in particular to detect and/or measure current-voltage characteristics. In certain such embodiments, current generation and light conversion can be detected as a function of illumination. In various other non-limiting embodiments, a bias can be applied over and/or along a surface of such a device. Accordingly, such a device can be topographically mapped. In certain such embodiments, current generation and/or light conversion can be mapped simultaneously with device topography. Regardless of bias and/or application, such a device can comprise a solar cell. With bias applied over and/or along such a cell, current generation and/or light conversion can be detected as a function of distance. Regardless of device composition, function or utility, bias can be applied over and/or along a device surface. In certain such embodiments, spatial variations of power conversion efficiency can be correlated with illumination.

In part, this invention can also be directed to a conductive atomic microscope apparatus for spatial resolution of a photocurrent characteristic of a photovoltaic device. Such an apparatus can comprise a probe comprising a current conductive cantilever tip; an optics component opposite such a cantilever tip and comprising a solar light simulator and a lens arranged and configured to direct light to a photovoltaic device; and a photodetection component aligned with the cantilever tip and such an optics component for photocurrent detection and analysis.

In certain non-limiting embodiments, such an apparatus can comprise a scanner component. In certain such embodiments, such a scanner component can be vertically-aligned with a photodetection component. Regardless, in various non-limiting embodiments, as discussed above and illustrated elsewhere herein, such an apparatus can comprise an operative or operating photovoltaic device positioned between an optics component and the cantilever tip. In certain such embodiments, illustrating but one aspect of this invention, such a device can comprise a solar cell. Demonstrating a length-scale which can be associated with this invention, resolution can be realized with a solar cell comprising a surface area less than about 5 $\mu m^2$. Regardless of surface area or dimension, such a solar cell can comprise an optoelectric component selected from an organic material, an inorganic material, an organic-inorganic hybrid material, and combinations thereof.

In part, this invention can also be directed to a method for spatial-resolution of a photocurrent characteristic of a photovoltaic device. Such a method can comprise providing an operative photovoltaic device comprising an array of solar cells, each such cell comprising an anode, a cathode and at least one optoelectric component therebetween; contacting such a device with a conductive atomic force microscope apparatus, such an apparatus comprising a biased current conductive cantilever tip, an optics component and a scanner, such a device positioned between the cantilever tip and an optics component, with such a bias applied over and/or along a surface of such a device; illuminating such a device with an optics component; and correlating photocurrent of the illuminated device with cantilever tip position thereon. In certain non-limiting embodiments, current generation and/or light conversion can be mapped simultaneously with device topography. In certain other non-limiting embodiments, spatial variations of power conversion efficiency can be correlated with illumination.

DETAILED DESCRIPTION OF CERTAIN EMBODIMENTS

Various embodiments of this invention provide an alternative cAFM technique, atomic force photovoltaic microscopy (AFPM), which can quantitatively characterize variations in fully operational photovoltaic devices; e.g., without limitation, by scanning one or an array of solar cells. Analyzing devices more closely reproduces real-world operating conditions, enables standard photovoltaic figures of merit to be extracted, minimizes substrate-cAFM tip contact effects and—more generally—provides nanoscale characterization of a wide range of optoelectronically-active materials and devices.

Figure 1:
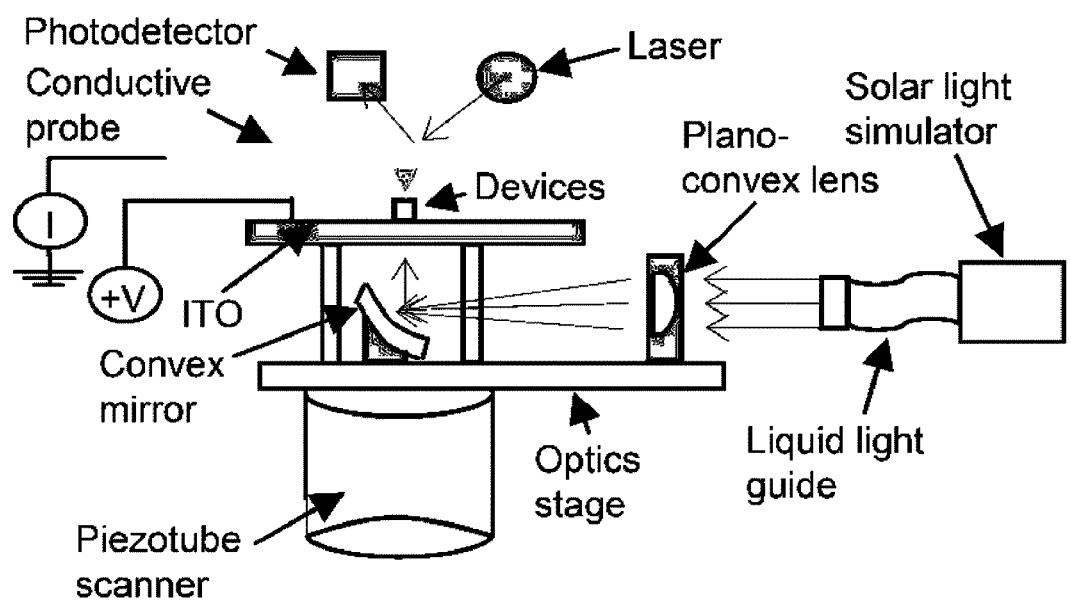
FIG. 1. A non-limiting schematic diagram of an atomic force photovoltaic microscope (AFPM) apparatus, in accordance with certain embodiments of this invention.

A schematic illustration of an apparatus 10, in accordance with this invention, is provided in FIG. 1. Scanning can be accomplished under ambient conditions, using a commercially-available cAFM, modified as described herein. More specifically, a conventional cantilever beam deflection component 12 detects deflection of probe assembly 14 as conducting tip 16 interacts with a surface of a photovoltaic device. Sample/device 1 (e.g., without limitation, an OPV device) is mounted on a piezotube scanner component 17 for scanning of the device of sample/device 1. Apparatus 10 includes a laser 18 for directing a beam of light toward cantilever 12 which, during operation, interacts with and reflects the laser toward photodetector 20. As understood in the art, apparatus 10 then measures the position of the deflected light beam which is indicative of the deflection of cantilever component 12 which, in turn, is a measure of the reaction force between tip 14 and the device surface. More specifically to the apparatus of FIG. 1, a positive bias can be applied while tip 16 is connected to current preamplifier 22 acting as a virtual ground.

In one non-limiting embodiment, as shown in FIG. 1, optics stage 24 is designed to support optics component 26. Light from solar simulator 28 is focused by convex lens 30 and mirror 32 toward the device of sample/device 1. Regardless, it should be noted that implementation of the methodologies and techniques of this invention is not restricted to the specific components recited herein. Likewise, various other apparatus configurations can be used, as would be understood by those skilled in the art made aware of this invention. Nonetheless, an apparatus of this invention can be assembled and configured with components commercially available and used in conjunction with various other cAFM applications. See, e.g., the apparatus/component configurations described in the references incorporated herein.

With reference to FIG. 1 and as previously reported in conjunction with an atomic force electroluminescence (AFEM) technique, the glass substrate with the photovoltaic devices is attached to a lightweight (<5 g) optics stage. See, L. S.C. Pingree, M. M. Kern, B. J. Scott, T. J. Marks, and M. C. Hersam, Appl. Phys. Lett., 85, 344 (2004); and L. S. C. Pingree, M. T. Russell, B. J. Scott, T. J. Marks, and M. C. Hersam, Org. Electr., 8, 465 (2007). The stage is fabricated from plastic fasteners, and its small mass minimizes interference with the piezoelectric scanner on which it rests. All experiments were performed in contact-mode and ambient conditions on a ThermoMicroscopes CP Research AFM with Nanosensors boron-doped, diamond-coated silicon AFM probes (model DT-NCHR). Electrical connection is made to the indium-tin-oxide (ITO) anode by affixing a copper wire, and a DL Instruments current preamplifier measures the current through the cAFM probe, which scans across the array of cathodes at an applied force of 20-50 nN. Although the short-circuit current is typically on the order of 10 nA for these devices, currents <1 pA can be measured.

The devices are illuminated by a Newport Oriel 96000 solar light simulator. From the lamp housing, the light passes through an AM1.5G filter and then through a liquid light guide (Newport Oriel model 77638) having an average 85% transmittance from 400 to 2000 nm. Optics at the exit of the liquid light guide focus and collimate the light into a plano-concave lens on the optics stage. Finally, the light is focused by this lens onto a convex mirror and reflected onto the substrate, thereby illuminating the solar cells. The intensity of light reaching the substrate is measured by an Orion TH power meter and can be varied from ~6 to 10 suns (1 sun=100 mW/cm$^2$). Although some light reaches the photodiode in the AFM feedback loop, simply nulling the cantilever deflection signal after illumination allows normal scanning.

ITO-coated glass (sheet resistance ~10 Ω/sq, RMS roughness ~2.5 nm) purchased from Delta Technologies served as the substrate for all devices characterized. Before film deposition, the substrates are cleaned with a standard detergent/deionized water/solvent sonication process and then treated with UV-ozone or an O$_2$-plasma. P3HT was purchased from Rieke Metals and the PCBM from American Dye Source; both were purified by standard techniques.

Without limitation, illustrating but one embodiment of this invention, AFPM was used to characterize spatially localized inhomogeneities in OPV devices. In AFPM, a biased cAFM probe can be raster-scanned over an array of illuminated solar cells, simultaneously generating topographic and photocurrent maps. Representative of such apparatus and methods, AFPM was used to characterize 7.5 μm×7.5 μm poly(3-hexylthiophene):[6,6]-phenyl-C$_{61}$-butyric acid methyl ester (P3HT:PCBM) OPVs, revealing substantial device-to-device and temporal variations in the short-circuit current.

For the devices with a Baytron poly(3,4-ethylenedioxythiophene: poly(styrenesulphonate) (1:6) (PEDOT:PSS) intermediate layer, the ITO substrates are treated with O$_2$-plasma and then spin-coated with PEDOT:PSS for 30 s at 2800 rpm to deposit a 41-45 nm film. Following a 1-h anneal at ~110° C. under vacuum, the substrates are transferred to a glove box (<1 ppm O$_2$) and then spin-coated with a 1:1 solution of P3HT:PCBM dissolved in purified 1,2-dichlorobenze. The P3HT:PCBM solution is spin-coated onto the PEDOT:PSS layer for 60 s at 550 rpm, allowed to dry in the glove box, and then annealed at ~110° C. Although such devices are often dried slowly in covered Petri dishes, the shorter drying times used here (<5 min) reduce film roughness and significantly improve the probe-sample contact. For devices without PEDOT:PSS, the BHJ film was deposited under the same conditions, but the ITO was UV-ozone cleaned. In both cases, 7.5 μm×7.5 μm gold cathodes were then thermally evaporated through a copper mesh TEM grid (Ted Pella, Inc) at 0.2-0.3 Å/s to a thickness of ~50 nm on the P3HT:PCBM film. Gold was initially used as the cathode material because of its resistance to oxidation under the ambient test conditions.

Figure 2A:
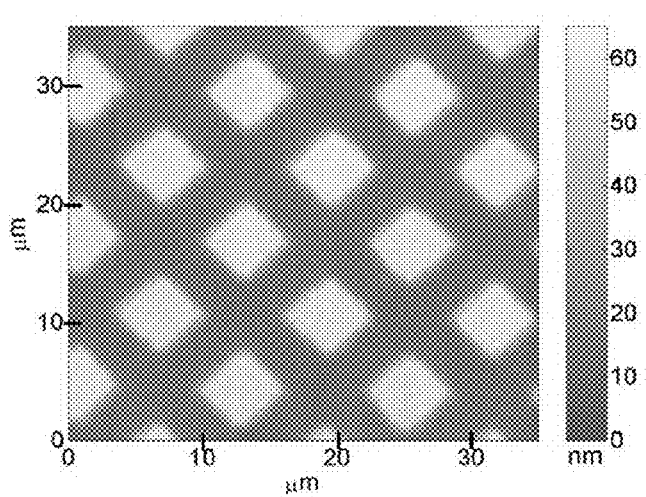
FIGS. 2A-C. (A) AFPM topographic map of a 7.5 $\mu m \times 7.5$ $\mu m$ OPV array. (B) AFPM current map at 0.0 V applied bias and (C) AFPM current map at −0.50 V applied bias. In the AFPM current maps, the absolute value of the photocurrent is depicted.
Figure 2B:
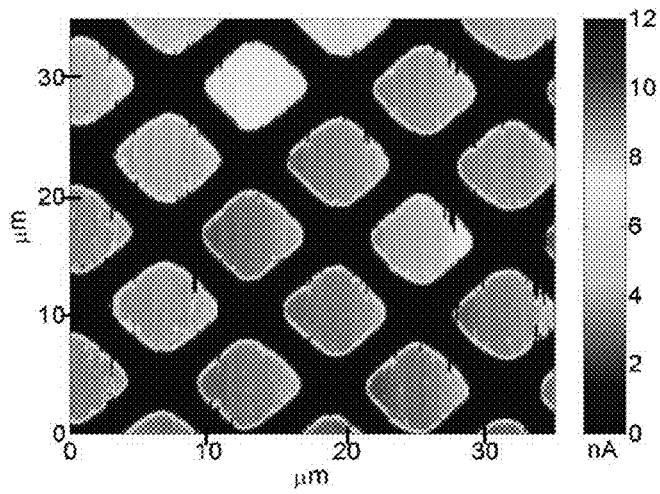
Figure 2C:
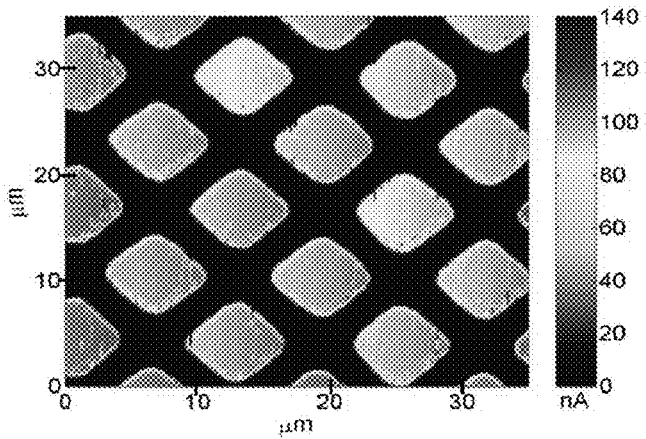

FIG. 2 shows simultaneous AFPM topography-current maps from P3HT:PCBM OPVs fabricated without a PEDOT:PSS layer. The current maps in FIGS. 2(b) and 2(c) were collected sequentially from the same set scan area, with the sample bias changed from 0.0 V (I$_{sc}$) in the former to −0.50 V in the latter. Devices were illuminated at ~6.7 suns in both scans. The scans show similar device-to-device variations, including a difference in I$_{sc}$ up to ~25% between OPVs separated by <10 μm. As phase separation is known to occur in these films at length scales far smaller than the 56 μm$^2$ area of these devices, the observed current variations are likely due to inhomogeneities in the bulk P3HT:PCBM film or in the ITO surface. Similar variations are observed in devices that include PEDOT:PSS and in organic light-emitting diodes of the same scale, arguing that they do not arise from the PEDOT:PSS alone.

In addition to scanning device arrays, solar cells can also be individually addressed by the cAFM probe to measure current-voltage characteristics. These devices exhibit S-shaped I-V plots and low fill factors (~18.5%), characteristic of marginal active layer/cathode interfaces. (This behavior may be attributable to LiF not applied prior to gold deposition and because the deposition conditions are significantly harsher for gold than for aluminum.) The devices exhibit a short-circuit current density of ~18 mA/cm$^2$ (under 6.7 suns illumination), an open-circuit voltage of ~225 mV, and a power conversion efficiency of ~0.11%.

Figure 3:
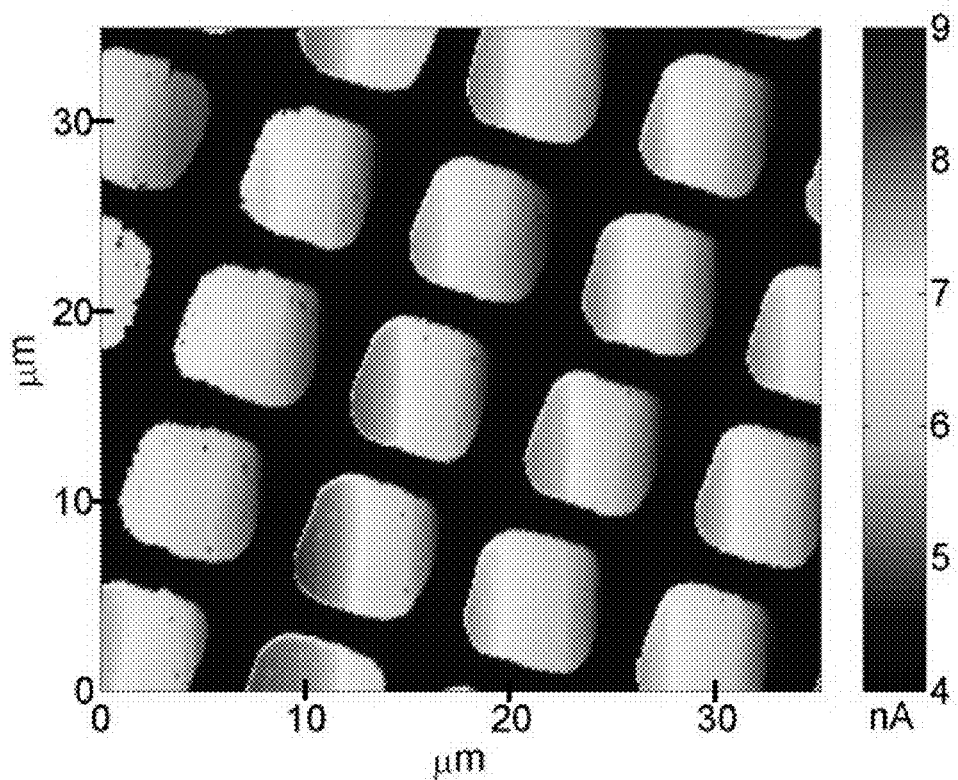
FIG. 3. Short-circuit transient response of OPV devices in air. Devices are illuminated at 6.7 suns and are first contacted at the left edge. Note that the absolute value of the photocurrent is depicted and that the current scale bar is truncated compared to FIG. 2.

Scanning the OPVs at a constant bias also reveals temporal variations in the photocurrent under ambient conditions. Although these temporal variation are present in FIG. 2, they are more easily visualized when the current scale of the photocurrent map is truncated as in FIG. 3. In FIG. 3, devices scanned at I$_{sc}$ exhibit a transient response with I$_{sc}$ decaying by ~40% during the ~1 min that the probe is in contact with the device (fast scan direction is top to bottom; slow scan direction is left to right). Different substrates scanned at different tip speeds show essentially the same decay rate, which exceeds the reported degradation rate for similar devices due to air and light exposure. The increased degradation rate may be related to factors including the high illumination intensity, the large portion of the active layer exposed directly to air, the thinness of the cathode, and a non-optimum active layer/cathode interface.

As discussed above, AFPM probes the performance of functioning devices instead of the film itself, a notable point because the probe-sample interaction impacts the current signal in cAFM. With the latter, the conductive probe scans a rough surface (such as a phase-separated photovoltaic film), and the contact area between the probe and sample are likely continuously changing. As such, the resulting current map can be a convolution of the true electrical properties of the sample and the variable sample-probe contact.

In conjunction with the AFPM techniques of this invention, such concerns can be significantly reduced by evaporating metal electrodes onto the photovoltaic film, as part of solar cell fabrication. The contact between the relatively flat metal electrodes and the conductive probe is much more uniform than that with the film, enabling AFPM to deliver high fidelity data. One issue, however, remains, in that the photocurrent of the film is averaged over the size of the electrode, limiting the lateral resolution of the technique to the dimensions of the electrodes.

The spatial resolution discussed above (~60 $\mu m^2$) was determined by the openings in the shadow mask employed—a 2000 mesh transmission electron microscopy (TEM) grid. Enhanced lateral resolution can be realized by fabricating smaller devices; for instance, as small as ~3 $\mu m^2$ using TEM grids coated with a holey carbon film. Such TEM grids with carbon films are commercially available with a large variety of hole diameters and pitches. FIG. 4 compares a current map with the aforementioned 7.5 $\mu m \times 7.5$ $\mu m$ devices (A) with smaller ~2 $\mu m$ diameter devices (B) fabricated using a holey carbon film.

Figure 4A:
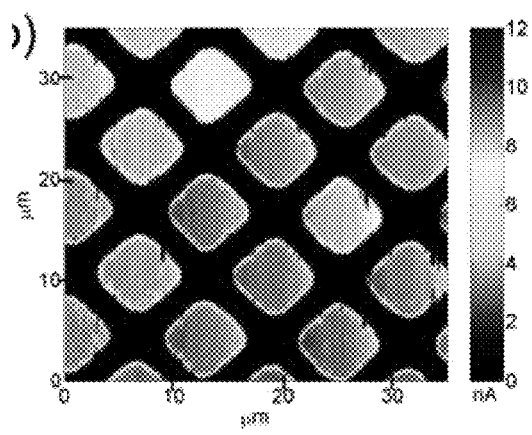
FIGS. 4A and 4B. Photocurrent maps of 60 $\mu m^2$ electrodes (A) and 3 $\mu m^2$ electrodes (B).
Figure 4B:
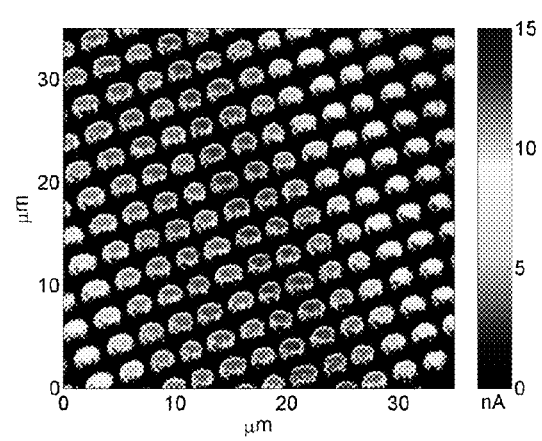

As shown in FIG. 4, the improved resolution provides additional information about spatially localized photocurrent variations within a sample, with the image in FIG. 4B exhibiting a much broader range of current variation than the image in FIG. 4A. Resolution can be improved even further with devices smaller than 1 $\mu m^2$, as can be fabricated from commercially available holey carbon films.

The impact of electrode deposition is clearly discernable in FIG. 4. As a general proposition, gold electrodes are attractive as they provide a relatively flat surface not susceptible to oxidization during scanning. Gold evaporation, however, requires relatively high temperatures, which can damage an organic-metallic interface. While the resulting devices enabled a probe of photocurrent variation, the gold electrode reduced device performance versus standard macroscopic solar cells with aluminum electrodes.

To improve the organic-metallic interface while maintaining a passivated surface, a layer of aluminum was first deposited followed by a thin layer of gold. The resulting devices do not exhibit the same transient decay shown by solar cells with gold electrodes, and also show significantly improved performance. Because photocurrent scales with size, the smaller devices in FIG. 4B would be expected to produce about 5% as much photocurrent as the larger devices in FIG. 4A. Due to the improved device construction, however, the smaller devices actually produce about the same amount of photocurrent as the larger solar cells.

As demonstrated, the AFPM methods, apparatus and related techniques of this invention can be used to quantitatively measure spatial performance variations in operative, functioning photovoltaic devices. For instance, microscopic solar cells can be individually addressed, enabling quantification of local $\eta_p$ and other benchmarks. Furthermore, temporal variations in photovoltaic response can be directly visualized. The flexibility of AFPM permits use over a range of applications. For instance, a photovoltaic device can be characterized by evaluating defect density and $\eta_p$ as a function of device area. These and various other characterizations can be made in conjunction with increasing spatial resolution through the use of smaller electrodes. Other applications include evaluating devices fabricated with alternative (e.g., transparent) electrodes and/or different photoactive (e.g., organic, inorganic and/or organic-inorganic hybrid) layers to elucidate performance-spatial relationships in photovoltaic cells and/or to assure quality control during fabrication.

We claim:

1. A method of using conductive atomic force microscopy for photocurrent characterization of a photovoltaic device, said method comprising:
providing an operative photovoltaic device comprising an anode, a cathode and at least one optoelectric component therebetween;
contacting one of said device electrodes with a conductive atomic force microscope, said microscope comprising a biased current conductive cantilever tip;
illuminating said device; and
correlating photocurrent of said illuminated device with tip position thereon.

2. The method of claim 1 wherein said tip is at a position on one of said electrodes, and said bias is constant.

3. The method of claim 2 wherein current generation and light conversion are detected as a function of illumination.

4. The method of claim 1 wherein said bias is applied over the surface of said device.

5. The method of claim 4 wherein said device is topographically mapped.

6. The method of claim 5 wherein at least one of current generation and light conversion are mapped simultaneously with said device topography.

7. The method of claim 1 wherein said device comprises a solar cell, and said bias is applied over said solar cell.

8. The method of claim 7 wherein at least one of current generation and light conversion are detected as a function of distance.

9. The method of claim 1 wherein said bias is applied over the surface of said device.

10. The method of claim 9 wherein spatial variations of power conversion efficiency are correlated with illumination.

11. A conductive force microscope apparatus for spatial resolution of a photocurrent characteristic of a photovoltaic device, said apparatus comprising:
a probe comprising a current conductive cantilever tip;
an optics component supported by a scanner component opposite said cantilever tip, said optics component comprising a solar light simulator, a lens and a convex mirror arranged and configured to direct light from said simulator to a photovoltaic device; and
a photodetection component aligned with said cantilever tip and said optics component for photocurrent detection.

12. The apparatus of claim 11 wherein said scanner component is vertically-aligned with said photodetection component.

13. The apparatus of claim 11 contacting an operative photovoltaic device positioned between said optics component and said cantilever tip.

14. The apparatus of claim 13 wherein said device comprises a solar cell.

15. The apparatus of claim 14 wherein said solar cell comprises a surface area less than about 5 $\mu m^2$.

16. The apparatus of claim 15 wherein said solar cell comprises an organic optoelectric component.

17. A method for spatial-resolution of a photocurrent characteristic of a photovoltaic device, said method comprising:
providing an operative photovoltaic device comprising an array of solar cells, each said cell comprising an anode, a cathode and at least one optoelectric component therebetween;
contacting said device with a conductive atomic force microscope apparatus, said apparatus comprising a biased current conductive cantilever tip, an optics component and a scanner, said device positioned between said cantilever tip and said optics component, said bias applied over a surface of said device;
illuminating said device with said optics component, said illumination simulating solar light at wavelengths from 400 nm to 2000 nm; and
correlating photocurrent of said illuminated device with tip position thereon.

18. The method of claim 17 wherein at least one of current generation and light conversion are mapped simultaneously with said device topography.

19. The method of claim 17 wherein spatial variations of power conversion efficiency are correlated with illumination.

* * * * *